(12) United States Patent
Ishikawa et al.

(10) Patent No.: US 12,322,576 B2
(45) Date of Patent: Jun. 3, 2025

(54) MEMBER FOR USE IN PLASMA PROCESSING DEVICE, AND PLASMA PROCESSING DEVICE PROVIDED THEREWITH

(71) Applicant: KYOCERA Corporation, Kyoto (JP)

(72) Inventors: Kazuhiro Ishikawa, Shiga (JP); Takashi Hino, Yokohama (JP); Shuichi Saito, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 1074 days.

(21) Appl. No.: 16/969,486

(22) PCT Filed: Feb. 15, 2019

(86) PCT No.: PCT/JP2019/005709
§ 371 (c)(1),
(2) Date: Aug. 12, 2020

(87) PCT Pub. No.: WO2019/160121
PCT Pub. Date: Aug. 22, 2019

(65) Prior Publication Data
US 2020/0402771 A1    Dec. 24, 2020

(30) Foreign Application Priority Data

Feb. 15, 2018   (JP) ............................... 2018-025151
Feb. 15, 2018   (JP) ............................... 2018-025152

(51) Int. Cl.
*H01J 37/32*       (2006.01)
*C04B 41/50*       (2006.01)
(Continued)

(52) U.S. Cl.
CPC .... *H01J 37/32495* (2013.01); *C04B 41/5045* (2013.01); *C04B 41/87* (2013.01);
(Continued)

(58) Field of Classification Search
None
See application file for complete search history.

(56) References Cited

U.S. PATENT DOCUMENTS 6,641,941 B2   11/2003  Yamada et al.
6,933,025 B2    8/2005  Lin et al.
(Continued)

FOREIGN PATENT DOCUMENTS

CN    105247662 A     1/2016
CN    107313015 A    11/2017
(Continued)

*Primary Examiner* — Humera N. Sheikh
*Assistant Examiner* — Elizabeth D Ivey
(74) *Attorney, Agent, or Firm* — Procopio, Cory, Hargreaves & Savitch LLP

(57) ABSTRACT

A member for use in a plasma processing device of the disclosure includes a base material and a film containing yttrium oxide as a main component on the base material. An area occupancy of closed pores of the film is 0.2 area % or less, and a full width at half maximum of a diffraction peak on a (222) plane of yttrium oxide obtained by X-ray diffraction of the film is 0.25° or less. A plasma processing device according to the disclosure includes the member for use in a plasma processing device.

7 Claims, 2 Drawing Sheets

(51) Int. Cl.
 *C04B 41/87* (2006.01)
 *C23C 14/08* (2006.01)
 *C23C 14/34* (2006.01)

(52) U.S. Cl.
 CPC ............ *C23C 14/083* (2013.01); *C23C 14/34* (2013.01); *H01J 37/32477* (2013.01)

(56) References Cited

U.S. PATENT DOCUMENTS

| | | |
|---|---|---|
| 7,138,192 B2 | 11/2006 | Yamada et al. |
| 7,544,273 B2 | 6/2009 | Taneda et al. |
| 2002/0177001 A1 | 11/2002 | Harada et al. |
| 2005/0282034 A1 | 12/2005 | Hayasaki et al. |
| 2008/0029032 A1 | 2/2008 | Sun et al. |
| 2010/0081557 A1 | 4/2010 | Ide et al. |
| 2012/0103519 A1 | 5/2012 | Aheem et al. |
| 2014/0377504 A1 | 12/2014 | Sun et al. |
| 2015/0158775 A1* | 6/2015 | Sun .................... C23C 14/5806 428/332 |

FOREIGN PATENT DOCUMENTS

| | | |
|---|---|---|
| JP | 2002-1865 A | 1/2002 |
| JP | 2003-297809 A | 10/2003 |
| JP | 2005-97685 A | 4/2005 |
| JP | 2005-217349 A | 8/2005 |
| JP | 2008-156160 A | 7/2008 |
| JP | 2010-77017 A | 4/2010 |
| JP | 2010-195682 A | 9/2010 |

\* cited by examiner

MEMBER FOR USE IN PLASMA PROCESSING DEVICE, AND PLASMA PROCESSING DEVICE PROVIDED THEREWITH

CROSS-REFERENCE TO RELATED APPLICATIONS

This application is a national stage entry according to 35 U.S.C. 371 of International Application No. PCT/JP2019/005709 filed on Feb. 15, 2019, which claims priority to Japanese Patent Application Nos. 2018-025151 filed on Feb. 15, 2018, and 2018-025152 filed on Feb. 15, 2018, the contents of which are entirely incorporated herein by reference.

TECHNICAL FIELD

The present disclosure relates to a member for use in a plasma processing device and a plasma processing device provided therewith.

BACKGROUND

In a related art, as a member required to have high plasma resistance, a member for use in a plasma processing device, which includes a base material and a film made of yttrium oxide on the base material, has been used. In such a film, when the residual stress is large, there is a problem that the film is cracked or peeled, and it has been proposed to reduce the residual stress by improving the crystallinity of the film.

Specifically, Japanese Unexamined Patent Publication JP-A 2005-97685 (Patent Literature 1) describes that a full width at half maximum of a diffraction peak of yttrium oxide obtained by X-ray diffraction is 1.3° or less.

SUMMARY

Technical Problem

Recently, since the further improvement in corrosion resistance to plasma is required, a film having a narrow full width at half maximum is required. However, in the film formed by the sol-gel method in Japanese Unexamined Patent Publication JP-A 2005-97685 (Patent Literature 1), the minimum value of the full width at half maximum is 0.3° and it is considered difficult to achieve the full width at half maximum smaller than the above value by the sol-gel method.

As a film having small residual stress, a thermal spraying method is known, but a film formed by using the thermal spraying method has problems that the open porosity on the film surface or the closed porosity inside the film is large, or microcracks exist even inside the film.

The disclosure provides a member for use in a plasma processing device that is dense, has small residual stress, and is excellent in corrosion resistance, and a plasma processing device including the member for use in a plasma processing device.

Solution to Problem

A member for use in a plasma processing device of the disclosure includes a base material and a film containing yttrium oxide as a main component on the base material. A closed porosity of the film is 0.2% or less, and a full width at half maximum of a diffraction peak on a (222) plane of yttrium oxide obtained by X-ray diffraction of the film is 0.25° or less.

A plasma processing device of the disclosure includes the member for use in a plasma processing device.

Advantageous Effects of Invention

The member for use in a plasma processing device according to the disclosure is dense and has small residual stress, and thus is excellent in corrosion resistance.

The plasma processing device of the disclosure has high reliability.

BRIEF DESCRIPTION OF DRAWINGS

Objects, features, and advantages of the invention will be more apparent from the following detailed description and drawings.

DETAILED DESCRIPTION

Hereinafter, a member for use in a plasma processing device of the disclosure will be described in detail with reference to the drawings.

Figure 1:
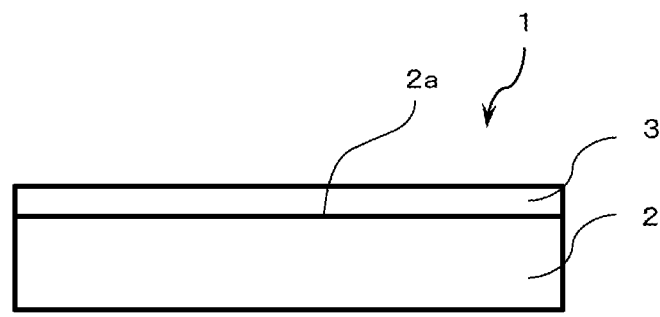
FIG. 1 is a schematic diagram showing a member for use in a plasma processing device according to an embodiment of the disclosure.

As shown in FIG. 1, a member 1 for use in a plasma processing device of the disclosure includes a base material 2 and a film 3 containing yttrium oxide as a main component on at least a part of the base material 2. FIG. 1 shows an example in which one upper surface 2a of the base material 2 is covered with the film 3. FIG. 1 schematically shows the film 3 to clarify the existence thereof and does not faithfully represent the thicknesses of the base material 2 and the film 3.

Examples of the base material 2 include quartz, aluminum having a purity of 99.999% (5N) or more, aluminum alloys such as aluminum 6061 alloy, aluminum nitride ceramics, and aluminum oxide ceramics. In the case of aluminum nitride ceramics and aluminum oxide ceramics, for example, the aluminum oxide ceramics are ceramics with 90 mass % or more of the aluminum oxide content, which is a value obtained by converting Al to $Al_2O_3$, out of a total of 100 mass % of the components constituting the base material 2. The aluminum oxide ceramics may contain magnesium oxide, calcium oxide, silicon oxide, and the like in addition to aluminum oxide.

Next, the film 3 mainly contains yttrium oxide. When the film 3 contains yttrium oxide represented by oxygen-deficient $Y_2O_{3-x}$ ($0<x<1$), the film 3 has semiconductivity, and thus, the charge on the surface of the film 3 can be reduced. In the film 3, the main component is a component that occupies 90 mass % or more out of 100 mass % of the components constituting the film 3.

The components constituting the base material 2 and the film 3 can be identified by an X-ray diffractometer using CuKα radiation and the content of each component can be determined by, for example, converting the content of each element obtained by an inductively coupled plasma (ICP) emission spectroscopy analyzer (ICP) or a fluorescent X-ray analyzer into that of an oxide. Regarding the film 3, if the presence of $Y_2O_3$ is confirmed by identification and the value obtained by converting the content obtained by ICP into that of $Y_2O_3$ is 90 mass % or more, it means that the film contains yttrium oxide as a main component.

In the film 3, an area occupancy of the closed pores is 0.2 area % or less. Here, the area occupancy of the closed pores being 0.2 area % or less means that the film is a dense film, which can be said that the film is less likely to undergo corrosion starting from the closed pores. Here, 0.2 area % or less of the area occupancy of the closed pores is a value smaller than that of the film obtained by the plasma spraying method, the suspension spraying method, or the aerosol deposition (AD) method. Since these film-forming methods use powder as a raw material, the area ratio of closed pores tends to increase.

An average value of equivalent circular diameters of closed pores of the film 3 may be 8 μm or less. When the average value of equivalent circular diameters of closed pores is within the range, the number of particles generated from the contour or inside of the closed pores can be reduced even if the surface of the film 3 is exposed to plasma and the inside of the film 3 is exposed.

A coefficient of variation of equivalent circular diameters of the closed pores of the film 3 may be 2 or less. If the coefficient of variation of equivalent circular diameters of the closed pores is within this range, there are almost no abnormally large closed pores, and thus, the generation of abnormally large particles from the contour or inside of the closed pores can be prevented even if the surface of the film 3 is exposed to plasma and the inside of the film 3 is exposed.

In particular, the coefficient of variation of equivalent circular diameters of the closed pores is preferably 1 or less.

Here, in the area occupancy of the closed pores of the film 3, the average value of the equivalent circular diameters, and the coefficient of variation of equivalent circular diameters, the surface polished to a position of 40% or more and 60% or less of the thickness of the film 3 with a polishing plate made of tin by using diamond abrasive grains having an average particle diameter of 1 μm or more and 5 μm or less is used as a measurement surface. Then, using a digital microscope (VHX-5000 manufactured by Keyence Corporation), the epi-illumination is set to coaxial epi-illumination, the intensity of the illumination is set to 255, and the ZS20 lens corresponding to the objective lens is set to 100-fold magnification. Next, the brightness is selected in the automatic area measurement mode in the range where the area is 7.223 $mm^2$ (horizontal length of 3.1 mm, and vertical length of 2.33 mm), and the dark areas (areas corresponding to closed pores) are extracted. Then, the threshold is set to, for example, −20 to carry out a measurement, and thus, the area occupancy of the closed pores of the film 3, the average value of the equivalent circular diameters, and the coefficient of variation of equivalent circular diameters can be calculated. Here, the threshold may be appropriately set according to the brightness of the dark areas. It is preferable to use the central part of the film as the measurement surface as described above since the measurement surface becomes a representative value of the closed pores of the film 3.

A full width at half maximum (FWHM) of a diffraction peak on a (222) plane of yttrium oxide obtained by X-ray diffraction of the film 3 is 0.25° or less. That is, since the crystallinity is high and the residual stress is small, the film 3 is less likely to be cracked or split. Although the value of the full width at half maximum defines only the upper limit, it is needless to say that the full width at half maximum cannot be zero and the full width at half maximum does not include zero. The full width at half maximum is preferably 0.05° or more.

The film 3 constituting the member 1 for use in a plasma processing device of the disclosure has an area occupancy of closed pores of 0.2 area % or less and the full width at half maximum of the diffraction peak on the (222) plane of yttrium oxide obtained by X-ray diffraction is 0.25° or less. Therefore, the film is dense and has small residual stress, and thus, is excellent in corrosion resistance to plasma.

The film 3 constituting the member 1 for use in a plasma processing device of the disclosure has a film thickness of 5 μm or more and 200 μm or less. The micro Vickers hardness Hmv of the film 3 is 7.5 GPa or more, which is extremely high hardness. For example, the film formed by the plasma spraying method includes about 10 to 20% closed pores. Therefore, the micro Vickers hardness Hmv of the plasma sprayed film is about 4.4 GPa. The method of measuring the micro Vickers hardness Hmv is carried out according to JIS R 1610 (2003). The measurement is carried out using the automatic microhardness test system AMT-X7FS manufactured by MATSUZAWA CO., LTD. with a test load of 0.4903 N (50 gf) and a holding force of 15 seconds. It is preferable to use a sample in which the film 3 is provided on the surface of the base material that is mirror-finished.

In particular, if the full width at half maximum is 0.130 or less, the corrosion resistance is improved due to the higher crystallinity.

In the film 3 constituting the member 1 for use in a plasma processing device of the disclosure, a shift amount of diffraction peak on the (222) plane of yttrium oxide toward the low angle side may be 0.3° or less. When the shift amount of diffraction peak on the (222) plane of yttrium oxide toward the low angle side is in this range, the expansion of the lattice spacing of the crystal of yttrium oxide is prevented, the residual stress inside the film 3 is further reduced and the risk of peeling from the base material 2 is reduced.

The full width at half maximum of the diffraction peak on the (222) plane of yttrium oxide and the shift amount to the low angle side can be measured using an X-ray diffractometer.

Next, a method for manufacturing the member 1 for use in a plasma processing device of the disclosure will be described.

First, a method for manufacturing the base material 2 will be described.

Aluminum oxide ($Al_2O_3$) A powder having an average particle size of 0.4 to 0.6 μm and aluminum oxide B powder having an average particle size of approximately 1.2 to 1.8 μm are provided. Silicon oxide ($SiO_2$) powder and calcium carbonate ($CaCO_3$) powder are prepared. As the silicon oxide powder, fine powder having an average particle size of 0.5 μm or less is prepared. Magnesium hydroxide powder is used to obtain aluminum oxide ceramics containing Mg. In the following description, powders other than the aluminum oxide A powder and the aluminum oxide B powder are collectively referred to as a first subcomponent powder.

Then, a predetermined amount of each of the first subcomponent powder is weighed. Next, the aluminum oxide A powder and the aluminum oxide B powder are weighed to be in a mass ratio of 40:60 to 60:40 and to have 99.4 mass % or more of the Al content converted to $Al_2O_3$ out of 100 mass % of the components constituting the obtained aluminum oxide ceramics, thereby obtaining an aluminum oxide blended powder. For the first subcomponent powder, preferably, the amount of Na in the aluminum oxide blended powder is first grasped and the amount of Na is converted to $Na_2O$ in the case of using aluminum oxide ceramics. Then, weighing is carried out so that the ratio between the above-converted value and the oxide-converted value of the components (in the present example, Si, Ca, and the like) constituting the first subcomponent powder is 1.1 or less.

Then, the aluminum oxide blended powder, the first subcomponent powder, and 1 to 1.5 parts by mass of PVA (polyvinyl alcohol) and the like as a binder, 100 parts by mass of a solvent, and 0.1 to 0.55 part by mass of a dispersant with respect to a total of 100 parts by mass of the aluminum oxide blended powder and the first subcomponent powder are put in a stirrer and mixed and stirred to obtain a slurry.

After that, the slurry is spray-granulated to obtain granules, the granules are molded into a predetermined shape by a powder press molding device, a hydrostatic pressure press molding device, or the like, and a cutting process is carried out as necessary to obtain a molded body including a substrate shape.

Next, after firing at a firing temperature of 1500° C. or higher and 1700° C. or lower and a holding time of 4 hours or longer and 6 hours or shorter, the surface on the side where the film is formed is polished using diamond abrasive grains having an average particle size of 1 μm or more and 5 μm or less and a polishing plate made of tin to obtain the base material 2.

Then, in order to obtain the member for use in a plasma processing device in which the closed porosity of the film 3 is 0.2 area % or less, it is sufficient that the open porosity on the upper surface 2a of the base material 2 on which the film 3 is formed is 8 area % or less.

Here, in order to set the open porosity of the upper surface 2a to 0.1% or less, it is sufficient that the surface on the side where the film is formed is polished using diamond abrasive grains having an average particle size of 1 μm or more and 3 μm or less and a polishing plate made of tin.

The open porosity on the upper surface 2a may be determined by using a digital microscope (VHX-5000 manufactured by Keyence Corporation) and the same method as described above.

Figure 2:
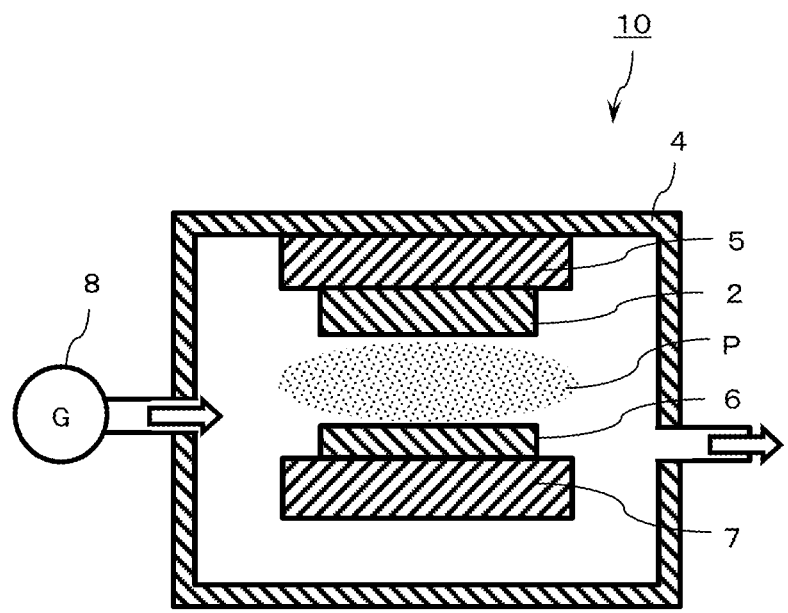
FIG. 2 is a schematic diagram showing a sputtering apparatus for obtaining the member for use in a plasma processing device according to the embodiment of the disclosure.

Next, a method of forming the film 3 will be described with reference to FIG. 2. FIG. 2 is a schematic diagram showing a sputtering apparatus 10, and the sputtering apparatus 10 includes a chamber 4, a gas supply source 8 connected to the chamber 4, an anode 5 and a cathode 7 which are located in the chamber 4, and a target 6 connected to the cathode 7 side.

As a method of forming the film 3, the base material 2 obtained by the above-described method is installed on the anode 5 side in the chamber 4. A rare earth element, here the target 6 containing metal yttrium as a main component, is installed on the opposite side in the chamber 4, that is, on the cathode 7 side. Here, the pressure inside the chamber 4 is reduced by an exhaust pump, and argon and oxygen are supplied as the gas G from the gas supply source 8.

Then, while controlling the pressure in the range of 0.3 Pa±0.1 Pa, an electric field is applied between the anode 5 and the cathode 7 by a power source to generate plasma P and carry out sputtering, thereby forming a metal yttrium film on the surface of the base material 2. The thickness in one round of formation is 0.5 nm or less. In order to achieve the full width at half maximum of 0.130 or less, it is sufficient that the thickness in one round of formation is 0.3 nm or less. In order to achieve the shift amount of diffraction peak toward the low angle side of 0.3° or less, it is sufficient that the temperature of the base material 2 is controlled to be room temperature to 200° C. Forming closed pores can be prevented by reducing the thickness in one round of formation.

Next, an oxidation process of the metal yttrium film is carried out. Then, the metal yttrium film formation and the oxidation process are alternately carried out for lamination so that the total thickness of the film 3 is 5 μm or more and 200 μm or less, and a member for use in a plasma processing device of the disclosure can be obtained. The power supplied from the power supply may be either high-frequency power or DC power. The thickness of the film 3 is preferably 10 μm or more. The durability can be improved by increasing the film thickness.

The member for use in a plasma processing device of the disclosure may be any member that is exposed to plasma. For example, the member is a high-frequency transmission window member that transmits high frequencies for generating plasma, a shower plate for dispensing gas for generating plasma, a susceptor for placing a semiconductor wafer thereon, and the like.

Next, the plasma processing device of the disclosure will be described. Since the plasma processing device of the disclosure includes the member for use in a plasma processing device of the disclosure, the plasma processing device can maintain excellent quality for a long period due to excellent corrosion resistance, and thus, has high reliability. Since the member for use in a plasma processing device has a long life, the productivity is improved.

Hereinafter, a member for use in a plasma processing device according to another embodiment of the disclosure will be described in detail with reference to the drawings.

Figure 3:
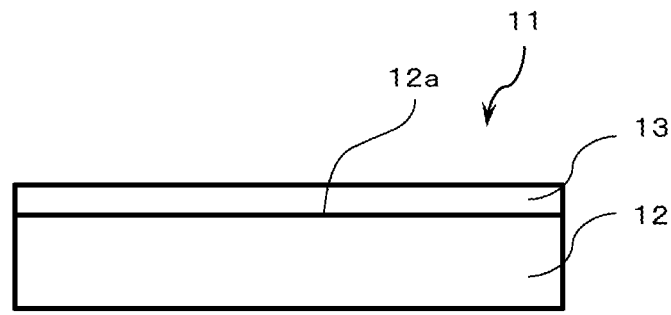
FIG. 3 is a schematic diagram showing a member for use in a plasma processing device according to another embodiment of the disclosure.

As shown in FIG. 3, a member 11 for use in a plasma processing device of the disclosure includes a base material 12 and a film 13 of an oxide of a rare earth element on at least a part of the base material 12. FIG. 3 shows an example in which one upper surface 12a of the base material 12 is covered with the film 13. FIG. 3 schematically shows the film 13 to clarify the existence thereof and does not faithfully represent the thicknesses of the base material 12 and the film 13.

The film 13 is an oxide of a rare earth element, and examples of the rare earth element include yttrium (Y), cerium (Ce), samarium (Sm), gadolinium (Gd), dysprosium (Dy), erbium (Er), and ytterbium (Yb). Here, when the rare earth element is yttrium, yttrium is excellent in corrosion resistance and is cheaper than other rare earth elements, and thus, yttrium is highly cost-effective.

The film 13 may contain substances other than oxide of a rare earth element, and depending on the purity of the target used when forming the film 13 and the apparatus configuration, fluorine (F), sodium (Na), magnesium (Mg), aluminum (Al), silicon (Si), phosphorus (P), sulfur (S), chlorine (Cl), potassium (K), calcium (Ca), titanium (Ti), chromium (Cr), manganese (Mn), iron (Fe), cobalt (Co), nickel (Ni), copper (Cu), zinc (Zn), strontium (Sr), or the like may be contained in addition to the rare earth element.

A coefficient of variation of thickness of the film 13 is 0.04 or less. The member 11 for use in a plasma processing device of the disclosure satisfying such a configuration can be used for a longer period than a member having a coefficient of variation of thickness exceeding this range.

Here, if explained using the reference numerals shown in FIG. 3, in a cross section perpendicular to the upper surface 12a of the base material 12 on which the film 13 is formed, the coefficient of variation is obtained by measuring the thickness from the upper surface 12a to the surface of the film 13 in a plurality of locations, and dividing the standard deviation of the obtained values by the average value.

An absolute value of skewness of thickness of the film 13 may be 1 or less.

When the absolute value of skewness of thickness is within the range, the distribution of the thickness becomes a normal distribution or a distribution close to the normal distribution and locally high stress is difficult to remain. Therefore, even if the film 13 is repeatedly exposed to plasma over a long period, it is possible to reduce the risk of the peeling of the film 13.

In particular, the skewness of thickness of the film 13 is preferably 0 or more and 1 or less.

Here, the skewness is how much the distribution is skewed from the normal distribution, that is, an index (statistical quantity) indicating the left-right symmetry of the distribution. The distribution tail moves to the right if the skewness is Sk>0, the distribution is symmetrical if the skewness Sk=0, and the distribution tail moves to the left if the skewness Sk<0.

The skewness of thickness may be obtained using a function SKEW provided in Excel (registered trademark, Microsoft Corporation).

Regarding the measurement, more specifically, the measurement is carried out by using a spectroscopic interferometer and under the refractive index of 1.92. At least 20 locations are measured so that there is no bias in a target observation region, for example, a region in which both the horizontal and vertical lengths are 50 mm.

In the member 11 for use in a plasma processing device of the disclosure having a coefficient of variation of thickness of 0.04 or less, a maximum height Rz of roughness profile on the surface of the film 13 is 6 μm or less. Here, the maximum height Rz of roughness profile on the surface of the film 13 can be measured according to JIS B 0601-2001 by using a laser microscope (manufactured by Keyence Corporation, an ultra-depth color 3D shape measuring microscope (VK-9500 or its successor model)). As the measurement conditions, the magnification is 1000-fold magnification (eyepiece: 20-fold magnification, objective lens: 50-fold magnification), the measurement mode is color ultra-depth, the measurement resolution (pitch) in the height direction is 0.05 μm, the optical zoom is 1.0 time, the gain is 953, the ND filter is 0, the measurement range is 278 μm×210 μm, the cutoff value λs is 2.5 μm, and the cutoff value λc is 0.08 mm. In calculating the numerical value, the number of n is set to 5 or more, and the average value of the obtained values is set as the maximum height Rz of the roughness profile on the surface of the film 13.

The film 13 in the member 11 for use in a plasma processing device of the disclosure has a thickness of 5 μm or more and 200 μm or less. The micro Vickers hardness Hmv of the film 13 is 7.5 GPa or more. The method of measuring the micro Vickers hardness Hmv is carried out according to JIS R 1610 (2003). The measurement is carried out by using the automatic microhardness test system AMT-X7FS manufactured by MATSUZAWA CO., LTD. with a test load of 0.4903 N (50 gf) and a holding force of 15 seconds. It is preferable to use a sample in which the film 13 is provided on the surface of the base material that is mirror-finished.

In the film 13, in particular, when the coefficient of variation of thickness is 0.025 or less, the life of the member 11 for use in a plasma processing device with the same average thickness is extended, which is highly cost-effective.

In the film 13, the area occupancy of the closed pores may be 0.2 area % or less. The area occupancy of the closed pores being 0.2 area % or less means that the film is a dense film, which can be said that the film is less likely to undergo corrosion starting from the closed pores. Here, 0.2 area % or less of the area occupancy of the closed pores is a value smaller than that of the film obtained by the plasma spraying method, the suspension spraying method, or the aerosol deposition (AD) method. Since the film-forming methods use powder as a raw material, the area ratio of closed pores tends to increase. For example, the film formed by the plasma spraying method includes about 10 to 20% closed pores. Therefore, the micro Vickers hardness Hmv of the plasma sprayed film is about 4.4 GPa.

An average value of equivalent circular diameters of closed pores of the film 13 may be 8 μm or less. When the average value of equivalent circular diameters of closed pores is within this range, the number of particles generated from the contour or inside of the closed pores can be reduced even if the surface of the film 13 is exposed to plasma and the inside of the film 13 is exposed.

A coefficient of variation of equivalent circular diameters of the closed pores of the film 13 may be 2 or less. If the coefficient of variation of equivalent circular diameters of the closed pores is within this range, there are almost no abnormally large closed pores, and thus, the generation of abnormally large particles from the contour or inside of the closed pores can be prevented even if the surface of the film 13 is exposed to plasma and the inside of the film 13 is exposed.

In particular, the coefficient of variation of equivalent circular diameters of the closed pores is preferably 1 or less.

Here, in the area occupancy of the closed pores of the film 13, the average value of the equivalent circular diameters, and the coefficient of variation of equivalent circular diameters, the surface polished to a position of 40% or more and 60% or less of the thickness of the film 13 with a polishing plate made of tin by using diamond abrasive grains having an average particle diameter of 1 μm or more and 5 μm or less is used as a measurement surface. Then, using a digital microscope (VHX-5000 manufactured by Keyence Corporation), the epi-illumination is set to coaxial epi-illumination, the intensity of the illumination is set to 255, and the ZS20 lens corresponding to the objective lens is set to 100-fold magnification. Next, the brightness is selected in the automatic area measurement mode in the range where the area is 7.223 mm$^2$ (horizontal length of 3.1 mm, vertical length of 2.33 mm), and the dark areas (areas corresponding to closed pores) are extracted. Then, the threshold is set to, for example, −20 to carry out a measurement, and thus, the area occupancy of the closed pores of the film 13, the average value of the equivalent circular diameters, and the coefficient of variation of equivalent circular diameters can be calculated. Here, the threshold may be appropriately set according to the brightness of the dark areas. As described above, it is preferable to use the central part of the film as the measurement surface as described above since the measurement surface becomes a representative value of the closed pores of the film 13.

The thickness of the film 13 is preferably 5 µm or more. The thickness of the film 13 may be 15 µm or more. When the coefficient of variation of thickness of the film 13 is 0.04 or less and the thickness of the film 13 is 15 µm or more, the film 13 can withstand long-term use in an environment exposed to plasma.

When the coefficient of variation of thickness of the film 13 is 0.04 or less, the area occupancy of the closed pores of the film 13 is 0.2 area % or less, and the thickness of the film 13 is 15 µm or more, the film 13 can withstand to be used for a longer period.

Next, examples of the base material 12 include quartz, aluminum having a purity of 99.999% (5N) or more, aluminum alloys such as aluminum 6061 alloy, aluminum nitride ceramics, and aluminum oxide ceramics. In the case of aluminum nitride ceramics and aluminum oxide ceramics, for example, the aluminum oxide ceramics are ceramics with 90 mass % or more of the aluminum oxide content, which is a value obtained by converting Al to $Al_2O_3$, out of a total of 100 mass % of the components constituting the base material 12. The aluminum oxide ceramics may contain magnesium oxide, calcium oxide, silicon oxide, and the like in addition to aluminum oxide.

Here, the components constituting the base material 12 and the film 13 can be identified by an X-ray diffractometer using CuKα radiation and the content of each component can be determined by, for example, converting the content of each element obtained by an inductively coupled plasma (ICP) emission spectroscopy analyzer or a fluorescent X-ray analyzer into that of an oxide.

Next, a method for manufacturing the member 11 for use in a plasma processing device of the disclosure will be described.

First, a method for manufacturing the base material 12 will be described.

Aluminum oxide ($Al_2O_3$) A powder having an average particle size of 0.4 to 0.6 µm and aluminum oxide B powder having an average particle size of approximately 1.2 to 1.8 µm are provided. Silicon oxide ($SiO_2$) powder and calcium carbonate ($CaCO_3$) powder are prepared. As the silicon oxide powder, fine powder having an average particle size of 0.5 µm or less is prepared. Magnesium hydroxide powder is used to obtain aluminum oxide ceramics containing Mg. In the following description, powders other than the aluminum oxide A powder and the aluminum oxide B powder are collectively referred to as the first subcomponent powder.

Then, a predetermined amount of each of the first subcomponent powder is weighed. Next, the aluminum oxide A powder and the aluminum oxide B powder are weighed to be in a mass ratio of 40:60 to 60:40 and to have 99.4 mass % or more of the Al content converted to $Al_2O_3$ out of 100 mass % of the components constituting the obtained aluminum oxide ceramics, thereby obtaining an aluminum oxide blended powder. For the first subcomponent powder, preferably, the amount of Na in the aluminum oxide blended powder is first grasped and the amount of Na is converted to $Na_2O$ in the case of using aluminum oxide ceramics. Then, weighing is carried out so that the ratio between the above-converted value and the oxide-converted value of the components (in the present example, Si, Ca, and the like) constituting the first subcomponent powder is 1.1 or less.

The aluminum oxide blended powder, the first subcomponent powder, and 1 to 1.5 parts by mass of PVA (polyvinyl alcohol) and the like as a binder, 100 parts by mass of a solvent, and 0.1 to 0.55 part by mass of a dispersant with respect to a total of 100 parts by mass of the aluminum oxide blended powder and the first subcomponent powder are put in a stirrer and mixed and stirred to obtain a slurry.

After that, the slurry is spray-granulated to obtain granules, the granules are molded into a predetermined shape by a powder press molding device, a hydrostatic pressure press molding device, or the like, and a cutting process is carried out as necessary to obtain a molded body including a substrate shape.

Next, after firing at a firing temperature of 1500° C. or higher and 1700° C. or lower and a holding time of 4 hours or longer and 6 hours or shorter, the surface on the side where the film is formed is polished using diamond abrasive grains having an average particle size of 1 µm or more and 5 µm or less and a polishing plate made of tin to obtain the base material 12.

Figure 4:
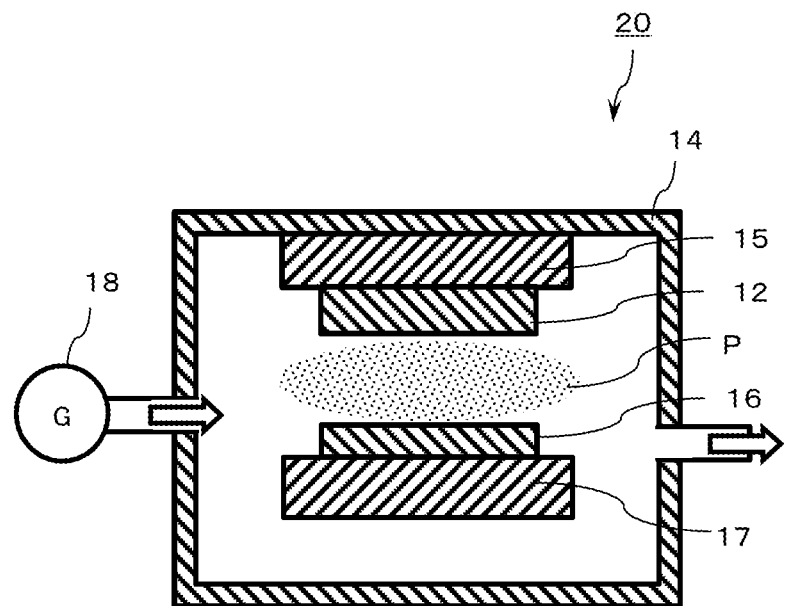
FIG. 4 is a schematic diagram showing a sputtering apparatus for obtaining the member for use in a plasma processing device according to another embodiment of the disclosure.

Next, a method of forming the film 13 will be described with reference to FIG. 4. FIG. 4 is a schematic diagram showing a sputtering apparatus 20, and the sputtering apparatus 20 includes a chamber 14, a gas supply source 18 connected to the chamber 14, an anode 15 and a cathode 17 which are located in the chamber 14, and a target 16 connected to the cathode 17 side.

As a method of forming the film 13, the base material 12 obtained by the above-described method is installed on the anode 15 side in the chamber 14. The target 16 containing a rare earth element (metal yttrium here) as a main component, is installed on the opposite side in the chamber 14, that is, on the cathode 17 side. Here, the pressure inside the chamber 14 is reduced by an exhaust pump, and argon and oxygen are supplied as the gas G from the gas supply source 8.

While controlling the pressure in the range of 0.3 Pa±0.1 Pa, an electric field is applied between the anode 15 and the cathode 17 by a power source to generate plasma P and carry out sputtering, thereby forming a metal yttrium film on the surface of the base material 12. The thickness in one round of formation is sub-nm. Next, an oxidation process of the metal yttrium film is carried out. Then, the metal yttrium film formation and the oxidation process are alternately carried out for lamination so that the total thickness of the film 13 is 10 µm or more and 200 µm or less, and a member for use in a plasma processing device of the disclosure can be obtained. The power supplied from the power supply may be either high-frequency power or DC power.

The member for use in a plasma processing device of the disclosure may be any member that is exposed to plasma. For example, the member is a high-frequency transmission window member that transmits high frequencies for generating plasma, a shower plate for dispensing gas for generating plasma, a susceptor for placing a semiconductor wafer thereon, and the like.

Next, the plasma processing device of the disclosure will be described. Since the plasma processing device of the disclosure includes the member for use in a plasma processing device of the disclosure, the plasma processing device is less likely to cause quality deterioration due to the exposure of the base material in the thin portion of the film and the product quality can be maintained. Since a sudden replacement of the member for use in the plasma processing device is less likely to occur, the production efficiency is less likely to decrease. Since the variation in the replacement time of the member for use in the plasma processing device is small, the replacement time can be predicted, and the replacement schedule can be set easily, the production efficiency is improved as a result.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein. For example, the invention resulting from the combination of the embodiments of the disclosure is also within the scope of the invention.

REFERENCE SIGNS LIST 1, 11: Member for use in plasma processing device
2, 12: Base material
3, 13: Film
4, 14: Chamber
5, 15: Anode
6, 16: Target
7, 17: Cathode
8, 18: Gas supply source
10, 20: Sputtering apparatus

The invention claimed is:

1. A member for use in a plasma processing device, comprising:
   a base material; and
   a film comprising yttrium oxide represented by oxygen-deficient $Y_2O_{3-x}$ ($0<x<1$) as a main component on at least a part of the base material,
   an area occupancy of closed pores of the film being 0.2 area % or less, and
   a full width at half maximum of a diffraction peak on a (222) plane of yttrium oxide obtained by X-ray diffraction of the film being 0.25° or less.

2. The member for use in a plasma processing device according to claim 1, wherein an average value of equivalent circular diameters of the closed pores of the film is 8 μm or less.

3. The member for use in a plasma processing device according to claim 1, wherein a coefficient of variation of equivalent circular diameters of the closed pores of the film is 2 or less.

4. The member for use in a plasma processing device according to claim 1, wherein the full width at half maximum of the film is 0.13° or less.

5. The member for use in a plasma processing device according to claim 1, wherein a shift amount of diffraction peak on the (222) plane of the yttrium oxide toward a low angle side of the film is 0.3° or less.

6. A plasma processing device, comprising:
   the member for use in a plasma processing device according to claim 1.

7. A member for use in a plasma processing device, comprising:
   a base material; and
   a film comprising yttrium oxide represented by oxygen-deficient $Y_2O_{3-x}$ ($0<x<1$) as a main component on at least a part of the base material,
   an area occupancy of closed pores of the film being 0.2 area % or less,
   a full width at half maximum of a diffraction peak on a (222) plane of yttrium oxide obtained by X-ray diffraction of the film being 0.25° or less, and
   a micro Vickers hardness Hmv of the film is 7.5 GPa or more.

* * * * *